(12) United States Patent
Pozzi et al.

(10) Patent No.: US 8,962,465 B2
(45) Date of Patent: Feb. 24, 2015

(54) METHODS OF FORMING GATED DEVICES

(71) Applicant: Micron Technology, Inc., Boise, ID (US)

(72) Inventors: Carlo Pozzi, Briosco (IT); Marcello Mariani, Milan (IT); Gianpietro Carnevale, Bottanuco (IT)

(73) Assignee: Micron Technology, Inc., Boise, ID (US)

( * ) Notice: Subject to any disclaimer, the term of this patent is extended or adjusted under 35 U.S.C. 154(b) by 306 days.

(21) Appl. No.: 13/652,305

(22) Filed: Oct. 15, 2012

(65) Prior Publication Data

US 2014/0106554 A1   Apr. 17, 2014

(51) Int. Cl.
*H01L 21/3205* (2006.01)
(52) U.S. Cl.
USPC .......................................... 438/589; 438/268
(58) Field of Classification Search
USPC .................................. 438/268, 589
See application file for complete search history.

(56) References Cited

U.S. PATENT DOCUMENTS

| 5,874,760 | A | 2/1999 | Burns, Jr. et al. |
| 6,653,174 | B1 | 11/2003 | Cho et al. |
| 2002/0094619 | A1 | 7/2002 | Mandelman et al. |
| 2008/0003774 | A1 | 1/2008 | Baek |
| 2011/0223731 | A1* | 9/2011 | Chung et al. .................. 438/270 |
| 2012/0223369 | A1 | 9/2012 | Gupta et al. |
| 2012/0228629 | A1 | 9/2012 | Nemati et al. |
| 2014/0008721 | A1* | 1/2014 | Filippini et al. ............... 257/332 |

OTHER PUBLICATIONS

Tzeng et al., "Dry Etching of Silicon Materials in SF6 Based Plasmas", J. Electrochem. Soc., 1987 vol. 134, issue 9, pp. 2304-2309.

* cited by examiner

*Primary Examiner* — Bradley K Smith
(74) *Attorney, Agent, or Firm* — Wells St. John P.S.

(57) ABSTRACT

Some embodiments include methods of forming gated devices. An upper region of a semiconductor material is patterned into a plurality of walls that extend primarily along a first direction. The walls are spaced from one another by trenches that extend primarily along the first direction. Steps are formed along bottoms of the trenches. Gatelines are formed on the steps and along lower regions of the walls. After the gatelines are formed, the walls are patterned into spaced-apart pillars that have bottom regions below the gatelines. In some embodiments the gated devices may be transistors or thyristors.

32 Claims, 14 Drawing Sheets

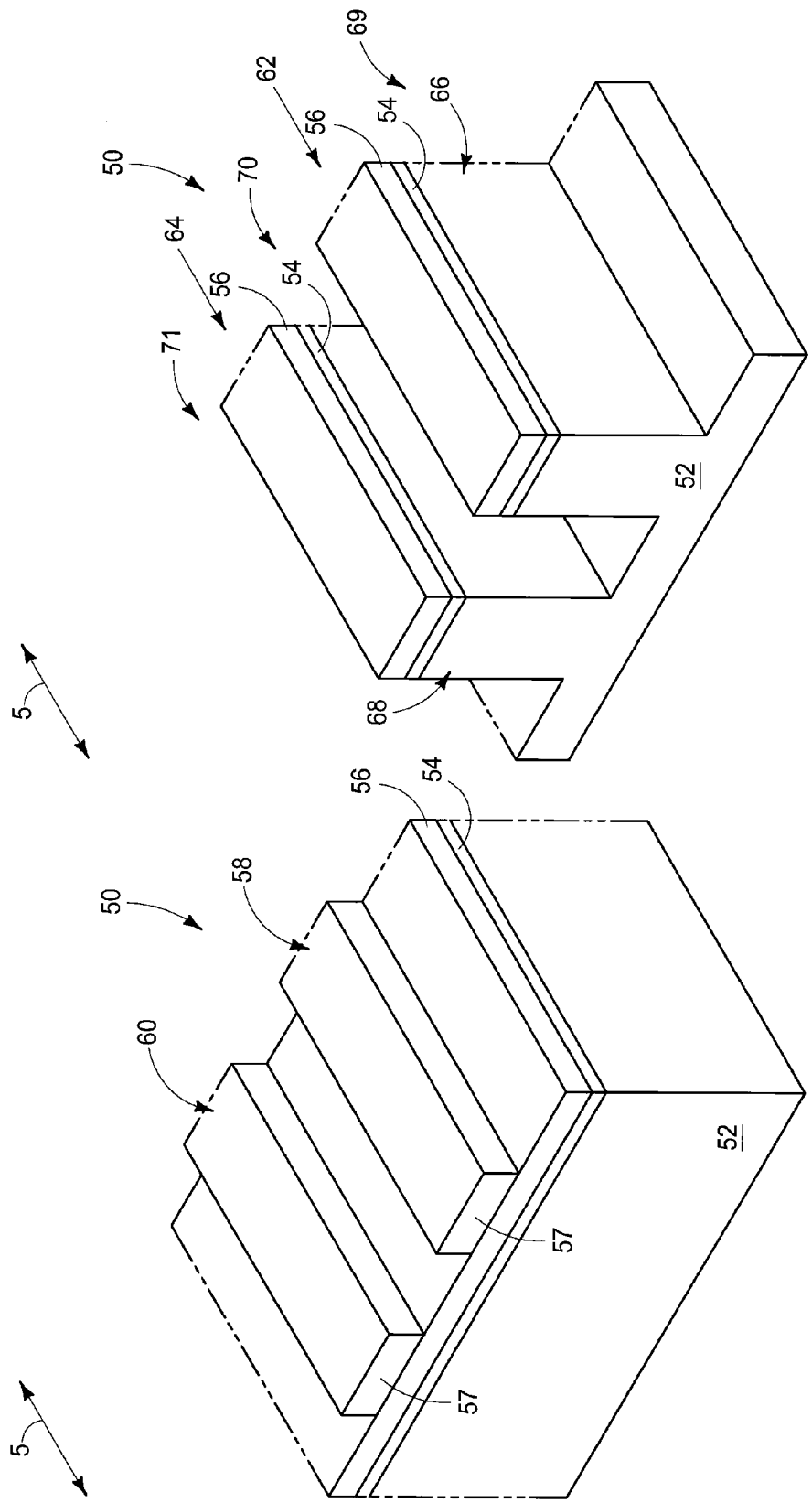

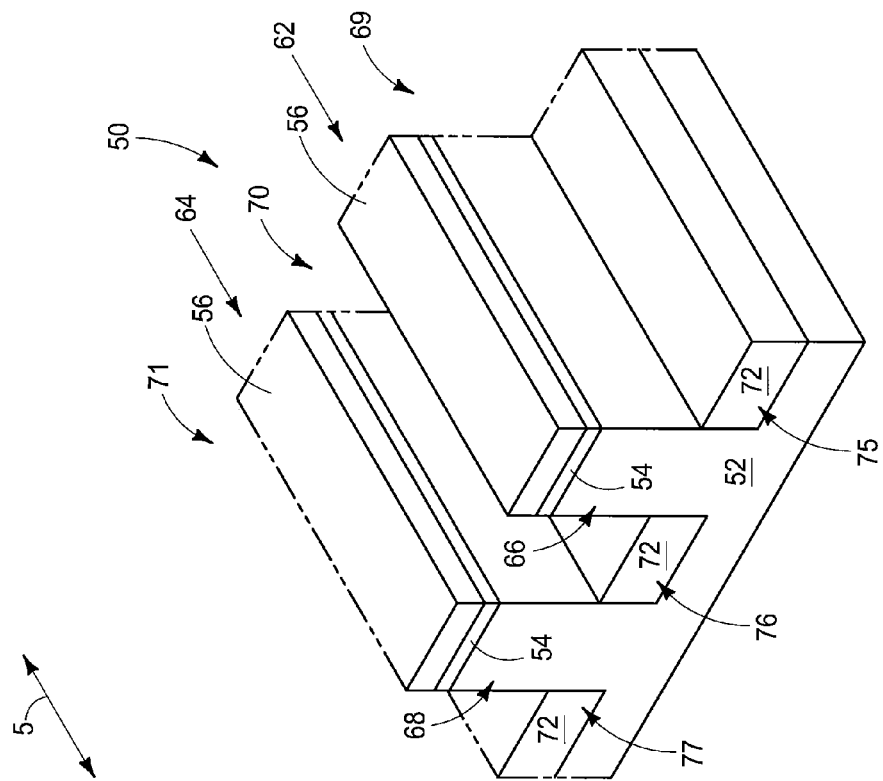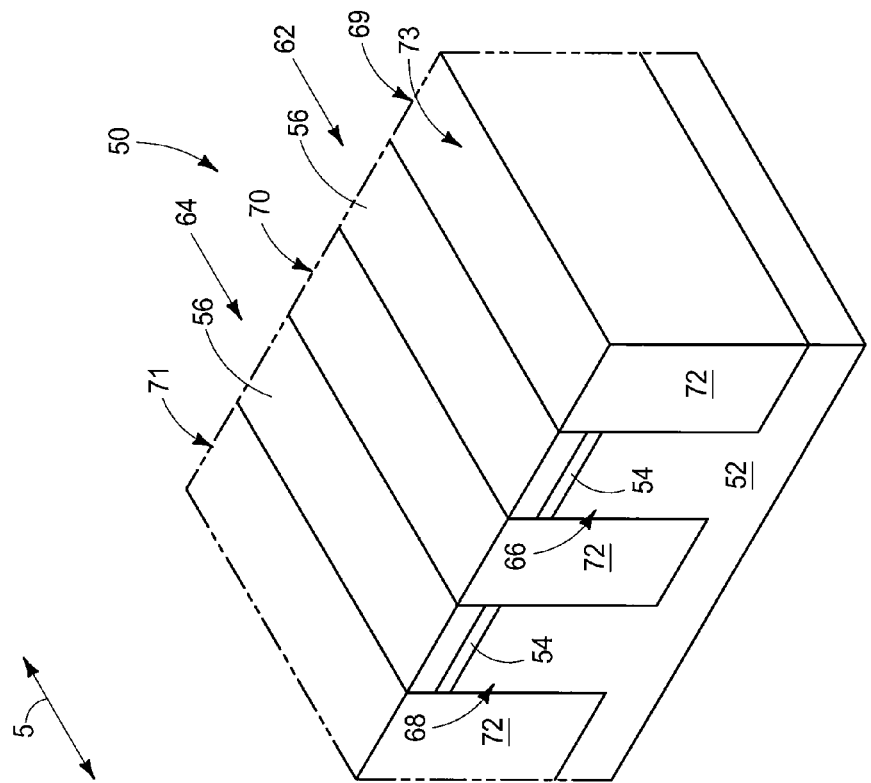

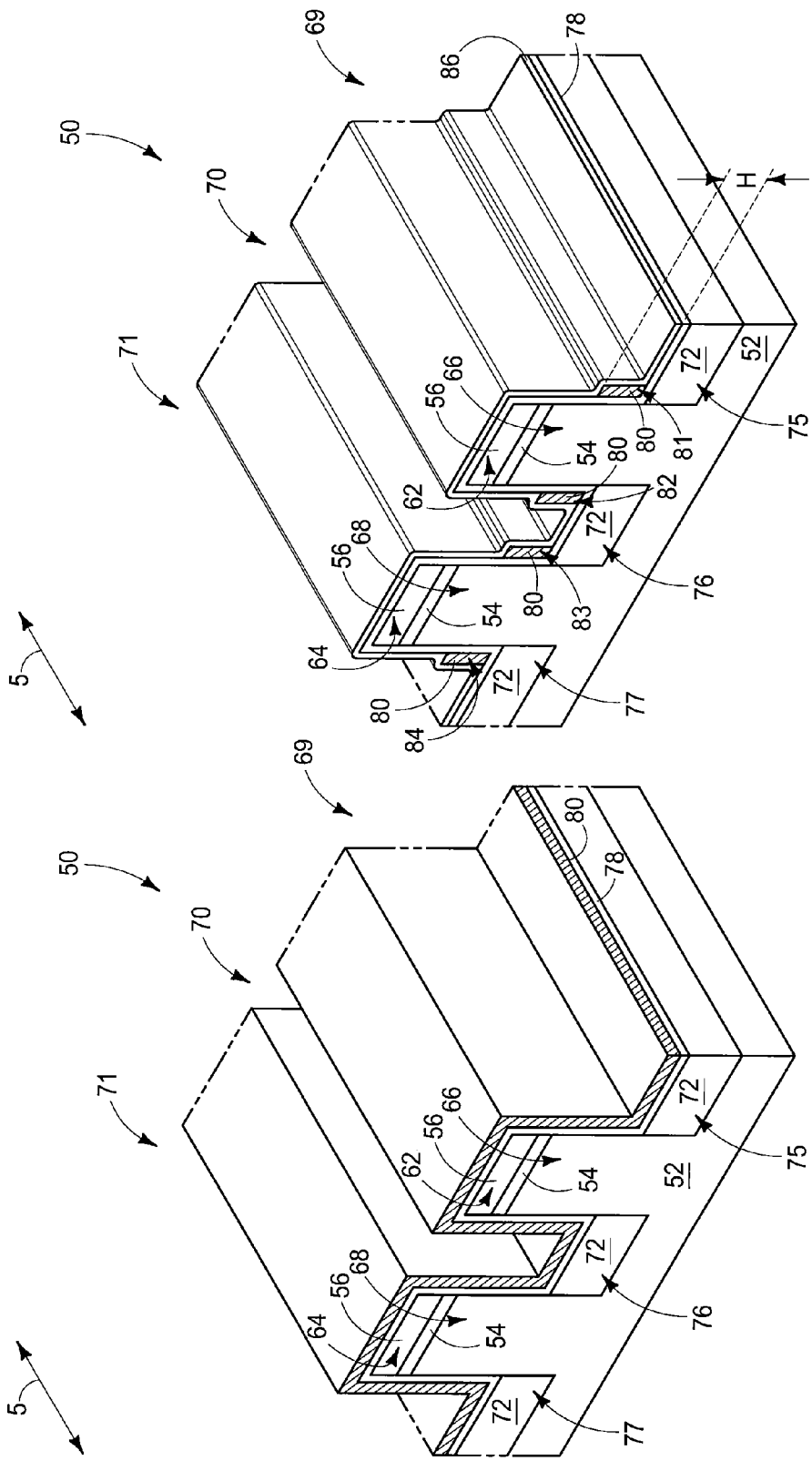

METHODS OF FORMING GATED DEVICES

TECHNICAL FIELD

Methods of forming gated devices.

BACKGROUND

Memory is one type of integrated circuitry, and is used in computer systems for storing data. Integrated memory is usually fabricated in one or more arrays of individual memory cells. The memory cells are configured to retain or store information in at least two different selectable states. In a binary system, the states are considered as either a "0" or a "1". In other systems, at least some individual memory cells may be configured to store more than two levels or states of information.

Gated devices may be utilized in memory and other integrated circuitry. Example gated devices are field effect transistors (FETs), gated bipolar junction transistors (gated BJTs) and gated thyristors. The processing utilized for fabrication of gated devices can be complex. Such complexities can be problematic in semiconductor fabrication processes in that they may increase costs, reduce throughput, and create risks of misalignment or other errors. Accordingly, it is desired to develop new methods of fabricating gated devices.

BRIEF DESCRIPTION OF THE DRAWINGS

FIGS. 3-17 are diagrammatic three-dimensional views of a portion of semiconductor construction shown at various process stages of an example embodiment method of forming gated devices.

DETAILED DESCRIPTION OF THE ILLUSTRATED EMBODIMENTS

Figure 2:
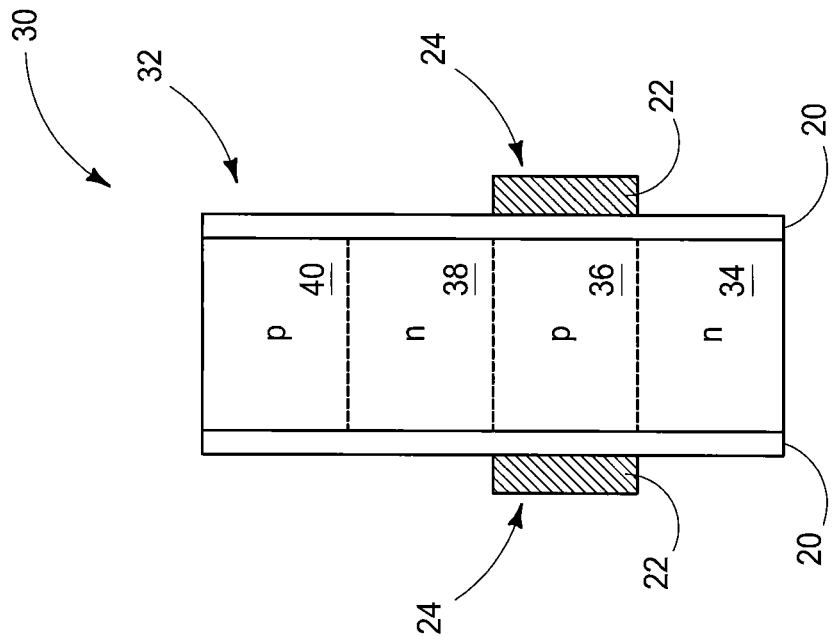
FIG. 2 is a diagrammatic cross-sectional view of an example embodiment gated thyristor.

Some embodiments include new methods of forming gated devices. A couple of example gated devices are shown in FIGS. 1 and 2; with FIG. 1 showing a gated transistor 10 and FIG. 2 showing a gated thyristor 30.

Figure 1:
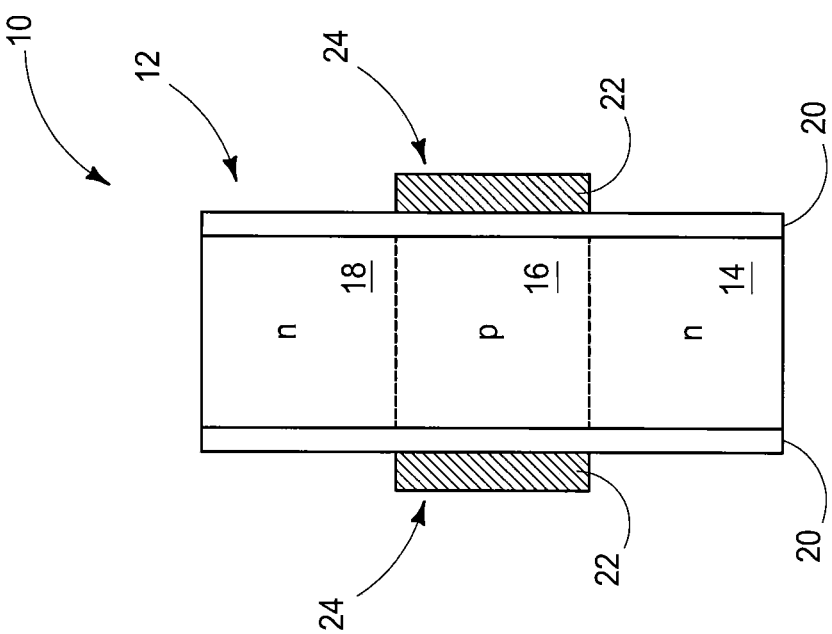
FIG. 1 is a diagrammatic cross-sectional view of an example embodiment gated transistor.

The transistor 10 of FIG. 1 comprises a vertical pillar 12 having three doped regions 14, 16 and 18 therein (dashed lines are utilized to show approximate boundaries of the doped regions). The vertical pillar 12 may comprise any suitable semiconductor material; and in some embodiments may comprise, consist essentially of, or consist of monocrystalline silicon. In the shown embodiment, the regions 14, 16 and 18 are n-type, p-type and n-type, respectively, so that the device 10 is an NPN device. In other embodiments, the conductivity types of regions 14, 16 and 18 may be reversed so that the device is a PNP device.

Gate dielectric material 20 is along sidewalls of pillar 12, and electrically conductive gate material 22 is along the gate dielectric and adjacent doped region 16. The gate material 22 forms gatelines 24 that may extend in and out of the page relative to the cross-section of FIG. 1. Although there appear to be two separate gatelines on the opposing sides of pillar 12, in practice such gatelines may be electrically connected to one another in a location outside of the page so that they are part of a single continuous gateline. Such gateline may extend only along the two opposing sides of pillar 12, or may wrap entirely around the pillar.

The transistor 10 of FIG. 1 may be a FET, or a gated BJT.

The thyristor 30 of FIG. 2 comprises a vertical pillar 32 having four doped regions 34, 36, 38 and 40 therein (dashed lines are utilized to show approximate boundaries of the doped regions). The vertical pillar 32 may comprise any suitable semiconductor material; and in some embodiments may comprise, consist essentially of, or consist of monocrystalline silicon. In the shown embodiment, the regions 34, 36, 38 and 40 are n-type, p-type, n-type, and p-type, respectively, so that the device 30 is an NPNP device. In other embodiments, the conductivity types of regions 34, 36, 38 and 40 may be reversed so that the device is a PNPN device.

Gate dielectric material 20 is along sidewalls of pillar 32, and electrically conductive gate material 22 is along the gate dielectric and adjacent doped region 36. The gate material 22 forms gatelines 24 that may extend in and out of the page relative to the cross-section of FIG. 2. Although there appear to be two separate gatelines on the opposing sides of pillar 32, in practice such gatelines may be electrically connected to one another in a location outside of the page so that they are part of a single continuous gateline. Such gateline may extend only along the two opposing sides of pillar 32, or may wrap entirely around the pillar.

An example embodiment method which may be utilized for forming gated devices of the types described with reference to FIGS. 1 and 2, or other gated devices, is described with reference to FIGS. 3-17.

Referring to FIG. 3, a semiconductor construction 50 comprises a semiconductor material 52 having masking materials 54 and 56 thereover. The masking materials 54 and 56 may comprise silicon dioxide and silicon nitride, respectively; with the silicon dioxide 54 being a pad oxide to alleviate stresses that could otherwise occur if the silicon nitride 56 directly contacted semiconductor material 52.

The semiconductor material 52 may comprise, consist essentially of, or consist of monocrystalline silicon, and may be referred to as a semiconductor substrate, or as a portion of a semiconductor substrate. The terms "semiconductive substrate," "semiconductor construction" and "semiconductor substrate" mean any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductive substrates described above. In some embodiments, the semiconductor material 52 may be part of a semiconductor substrate containing one or more materials associated with integrated circuit fabrication. In such embodiments, such materials may correspond to one or more of refractory metal materials, barrier materials, diffusion materials, insulator materials, etc.; and may be part of one or more integrated levels within or below the illustrated material 52. In some embodiments, the bottom of material 52 may comprise a plurality of electrically conductive bitlines, as discussed below with reference to FIGS. 18 and 19.

The material 52 of FIG. 3 may contain one or more doped regions analogous to the regions discussed above with reference to FIGS. 1 and 2. Alternatively, or additionally, such doped regions may be formed at a processing stage subsequent to that of FIG. 3.

A patterned mask 57 is formed over material 56, with such mask having masking features 58 and 60. The features 58 and 60 are lines extending primarily along a direction of an illustrated axis 5. In the shown embodiment, the lines are straight and extend exactly along axis 5. In other embodiments, the lines may be curved or wavy, but may still extend primarily along the direction of axis 5.

The patterned mask 57 may comprise any suitable material, such as a photolithographically-patterned photoresist and/or materials patterned utilizing pitch-multiplication methodologies. Accordingly, the lines 58 and 60 may have lithographic dimensions in some embodiments, and may have sub-lithographic dimensions in other embodiments.

Referring to FIG. 4, a pattern of lines 58 and 60 of masking material 57 (FIG. 3) is transferred through the masking materials 54 and 56, and into an upper region semiconductor material 52; and subsequently masking material 57 is removed. In some embodiments, such transfer may comprise a first step of transferring the pattern into masking material 56 to form material 56 into a patterned hard mask, followed by a transfer of the pattern from the patterned hard mask into semiconductor material 52. Such patterned hard mask comprises lines 62 and 64 which extend primarily along the direction of axis 5. In some embodiments, the patterned hard mask comprising lines 62 and 64 may be referred to as a "first patterned mask" to distinguish it from other patterned masks formed in subsequent processing stages. In such embodiments, the first patterned mask may be considered to comprise a series of first lines exemplified by the lines 62 and 64.

The patterned upper region of the semiconductor material 52 comprises walls 66 and 68 which extend primarily along the direction of axis 5; and such walls are spaced from one another by a trench 70 which also extends primarily along the direction of axis 5. Although FIGS. 3 and 4 show the semiconductor material 52 patterned into two walls, such walls are exemplary of a large number of walls that may be simultaneously formed within the semiconductor material, and similarly trench 70 is exemplary of a large number of trenches may be formed utilizing the processing of FIGS. 3 and 4. FIG. 4 shows portions of other trenches 69 and 71 on opposing sides of the walls 66 and 68 from trench 70.

Referring to FIG. 5, a dielectric material 72 is formed within trenches 69-71. In some embodiments, the dielectric material 72 may be formed to overfill trenches 69-71, and subsequently planarization (for instance chemical-mechanical polishing (CMP)) may be utilized to form the shown planarized surface 73 extending across materials 56 and 72. The dielectric material 72 may comprise any suitable composition or combination of compositions; and in some embodiments may comprise, consist essentially of, or consist of silicon dioxide.

Referring to FIG. 6, the dielectric material 72 is recessed within trenches 69-71 to form material 72 into steps 75-77 at the bottoms of trenches 69-71, respectively. The steps 75-77 are ultimately utilized for setting the locations of gatelines (described below with reference to FIG. 8) and may have any suitable heights for placing the gatelines at desired locations. The dielectric material 72 may be etched back with any suitable process, including, for example, a dry etch process.

Referring to FIG. 7, gate dielectric 78 and electrically conductive gate material 80 are formed over the steps 75-77 within trenches 69-71, and over the walls 66 and 68 of semiconductor material 52.

The gate dielectric 78 may comprise any suitable composition or combination of compositions; and in some embodiments may comprise, consist essentially of, or consist of silicon dioxide and/or any of various suitable high-k dielectric materials.

The electrically conductive gate material 80 may comprise any suitable composition or combination of compositions; and in some embodiments may comprise, consist essentially of or consist of one or more of various metals (for instance, titanium, tungsten, etc.), metal-containing compounds (for instance, metal silicides, metal nitrides, metal carbides, etc.), and conductively-doped semiconductor materials (for instance, conductively-doped silicon, conductively-doped germanium, etc.).

Referring to FIG. 8, the electrically conductive gate material 80 is etched to form electrically conductive gatelines 81-84 along lower regions of walls 66 and 68; with the gatelines being spaced from the walls by the gate dielectric 78. The gatelines extend along the walls, and thus extend primarily along the first direction of axis 5. The etch may be any suitable etch, and in some embodiments may be a dry etch.

The gatelines 81-84 have heights H. Such heights may be tailored by the type and duration of the etch utilized to form the gatelines.

Protective material 86 is formed over the gatelines; and in the shown embodiment is formed within trenches 69-71 and over walls 66 and 68. The protective material may protect the gatelines 81-84 from being exposed to oxidative materials in subsequent processing, and may comprise any suitable composition or combination of compositions. In some embodiments, the protective material 86 may comprise, consist essentially of, or consist of silicon nitride. The protective material 86 may be omitted in some embodiments, such as embodiments in which the gatelines will not be exposed to oxidative conditions in the absence of protective material 86.

In some embodiments, the protective material 86 may be considered to narrow trenches 69-71.

Figure 9:
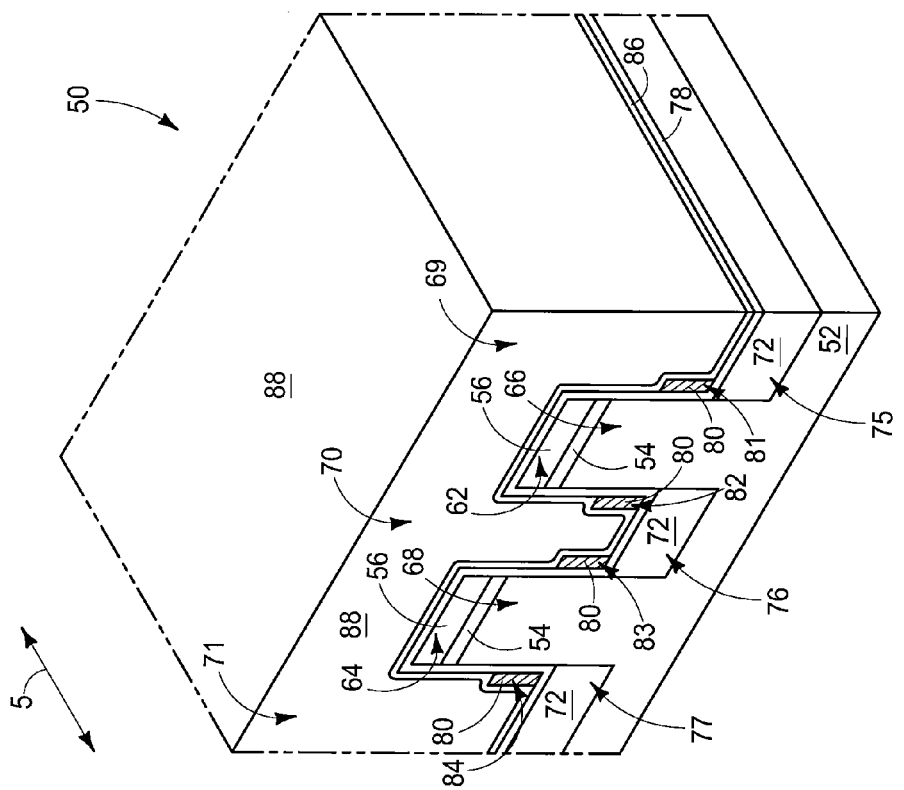

Referring to FIG. 9, dielectric material 88 is formed within the narrowed trenches 69-71. The dielectric material 88 may comprise any suitable composition or combination of compositions; and in some embodiments may comprise, consist essentially of, or consist of silicon dioxide. In some embodiments, such silicon dioxide may be formed by a two-step process which comprises: (1) initially depositing low-density silicon oxide; and then (2) subjecting the low-density silicon oxide to oxidizing conditions and a suitable anneal to densify the oxide. In such embodiments, protective material 86 can protect the gatelines 81-84 from exposure to the oxidizing conditions utilized during the densification. In some embodiments, dielectric material 88 may be a composition which can be formed directly against gatelines 81-84 without exposing such gatelines to oxidizing conditions, and in such embodiments protective material 86 may be omitted. In some embodiments, the dielectric materials 72 and 88 may be referred to as first and second dielectric materials, respectively, to distinguish them from one another.

Figure 10:
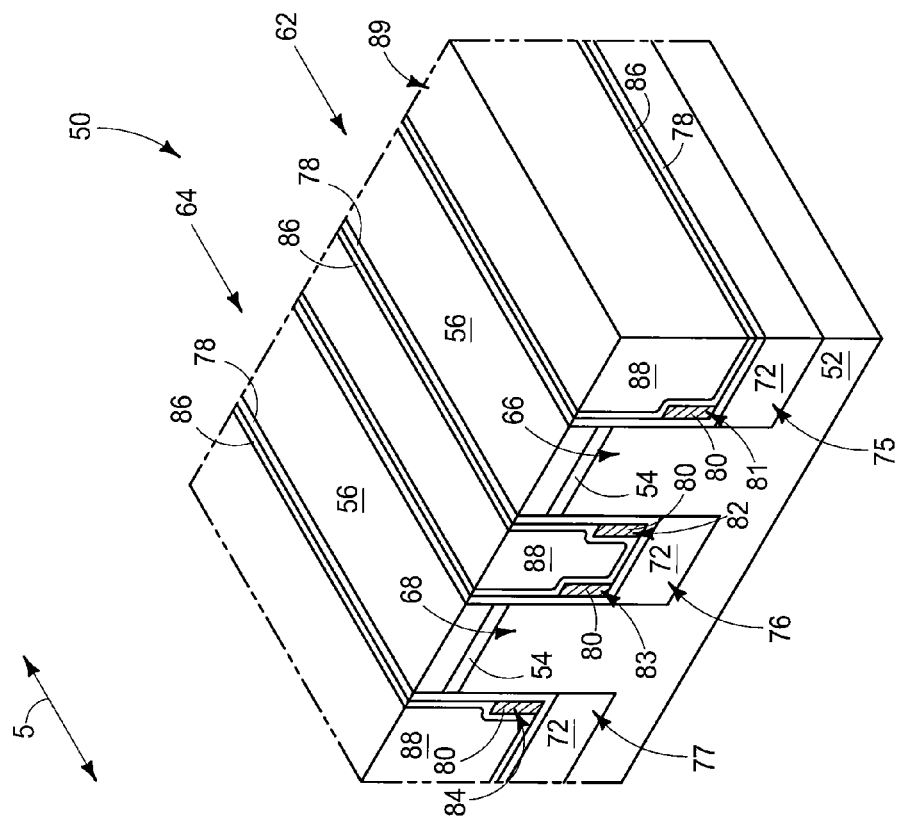

Referring to FIG. 10, construction 50 is subjected to planarizing conditions (for instance, CMP) to form a planarized surface 89 extending across materials 56, 78, 86 and 88. In some embodiments, material 56 comprises silicon nitride, and the planarization may comprise "stop-on-nitride" CMP.

Figure 11:
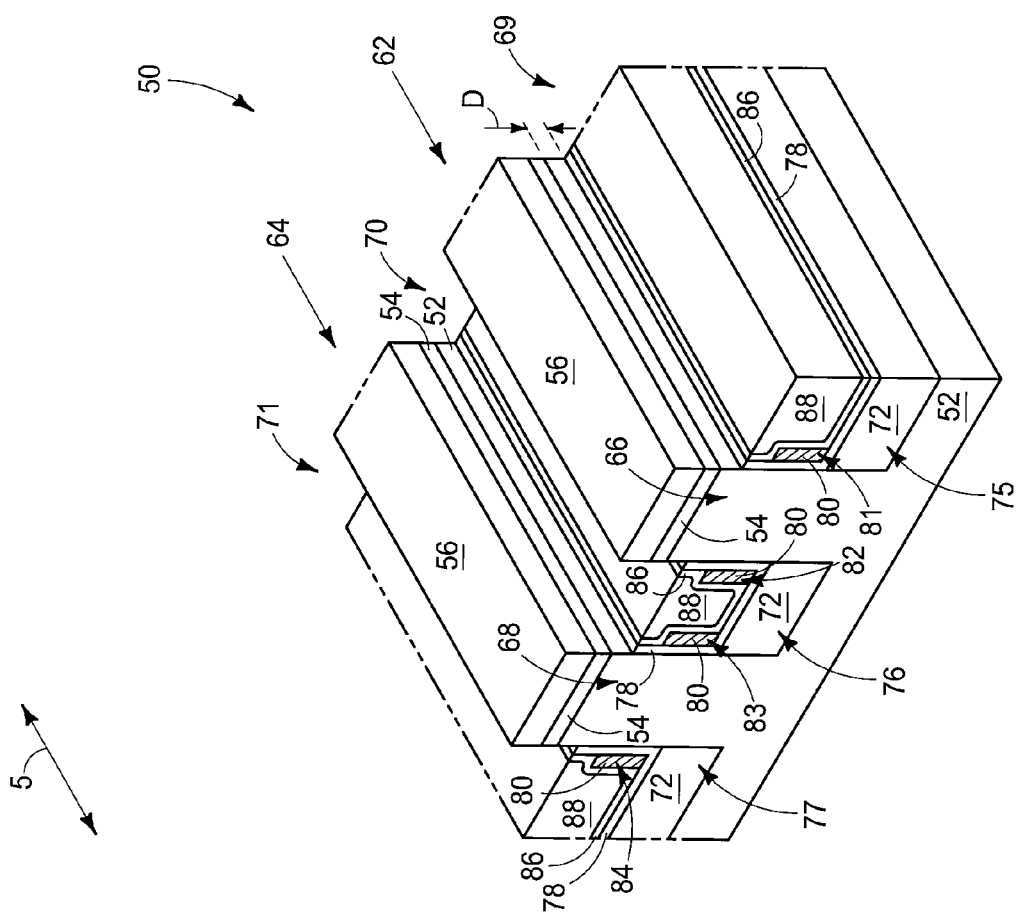

Referring to FIG. 11, the materials 78, 86 and 88 are recessed to a level below the patterned masking materials 54 and 56, which opens upper regions of the trenches 69-71 and exposes upper regions of the walls 66 and 68. In the shown embodiment, the materials 78, 86 and 88 are recessed to be below a bottom surface of material 54 by a distance "D". Such distance may be any suitable distance, and in some embodiments may be from about 10 nm to about 100 nm. The recessing of materials 78, 86 and 88 may be accomplished with any suitable etch, or combination of etches; and may be done with a protective mask, such as a photoresist mask, (not shown) being formed across material 56 in some embodiments, and without such protective mask in other embodiments.

Figure 12:
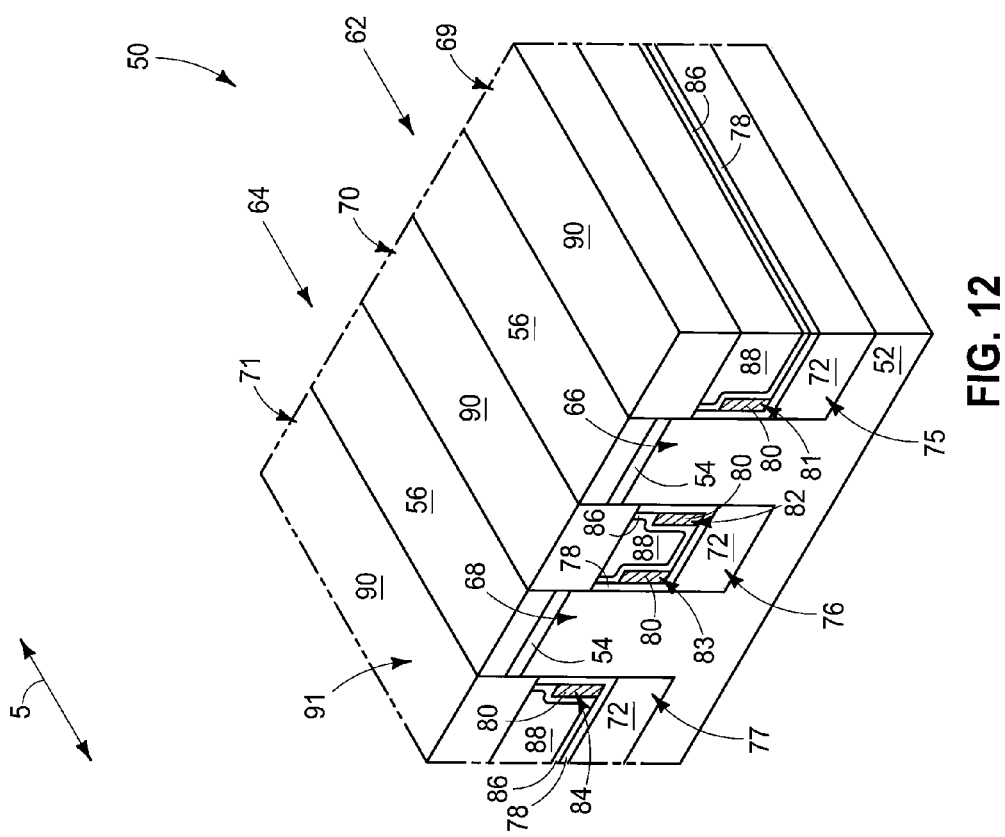

Referring to FIG. 12, carbon-containing material 90 is formed within the upper regions of trenches 69-71. Such carbon-containing material may comprise any suitable composition; and in some embodiments may comprise, consist essentially of, or consist of carbon-containing polymer, amorphous carbon and/or transparent carbon. The carbon-containing material may be initially formed to overfill the trenches and extend across upper surfaces of lines 62 and 64, and subsequently a dry etch-back and/or any suitable planarization (for instance, CMP) may be utilized to form the shown surface 91 extending across materials 56 and 90.

Figure 13:
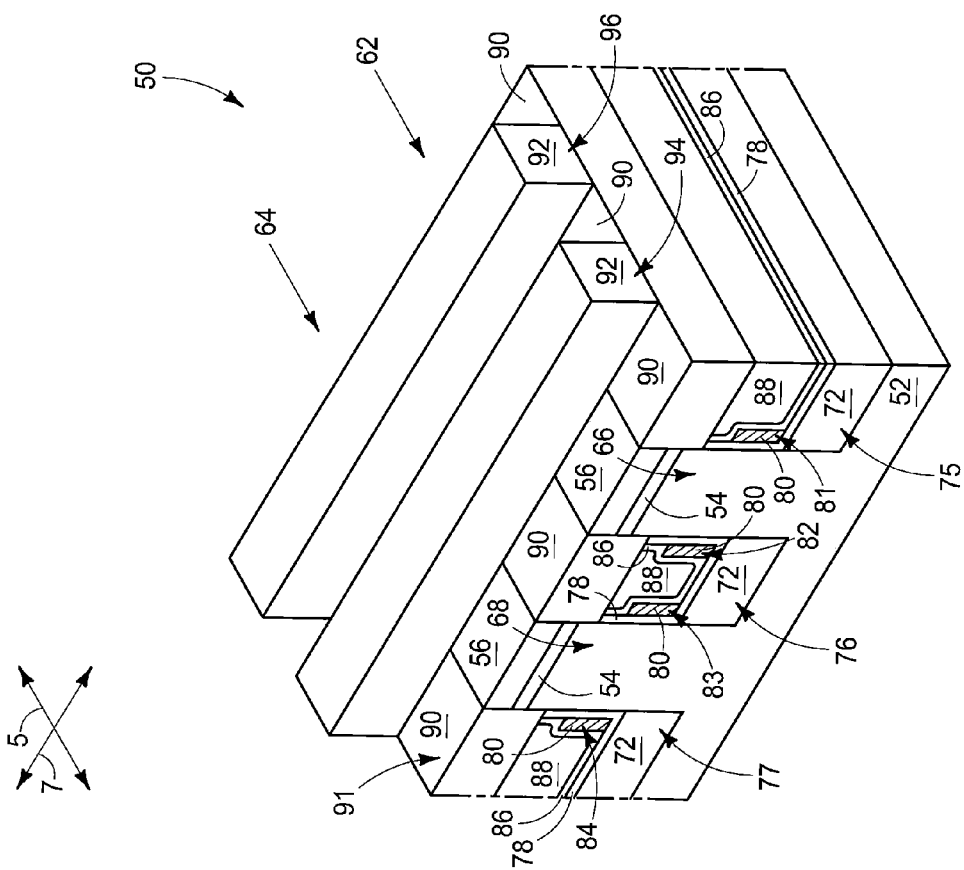

Referring to FIG. 13, patterned masking material 92 is formed on the surface 91. The masking material 92 is patterned into lines 94 and 96 that extend along a second direction that intersects the first direction of the lines 62 and 64. Specifically, the lines 62 and 64 extend primarily along a direction of an axis 5 (as discussed above with reference to FIG. 4) and the lines 94 and 96 extend primarily along a direction of an axis 7, which is shown to intersect the axis 5. In the shown embodiment, the axes 5 and 7 are orthogonal to one another. In other embodiments (not shown), the axes may be at other angles relative to one another. The masking material 92 may be a carbon-containing material, such as, for example, photolithographically-patterned photoresist. The lines 94 and 96 may have lithographic dimensions if they are formed of photolithographically-patterned photoresist. Alternatively, the lines 94 and 96 may have sub-lithographic dimensions if they are formed utilizing other patterning methods either in addition to, or alternatively to, photolithographic processing; with an example of such other methods being pitch-multiplication methodology.

In some embodiments, the lines 94 and 96 may be considered to be comprised by a second patterned mask which extends over the first patterned mask comprising lines 62 and 64, over the walls 66 and 68, and over the dielectric material 88. In some embodiments, materials 90 and 92 may be considered to be patterned into first and second carbon-containing masks, respectively.

Figure 14:
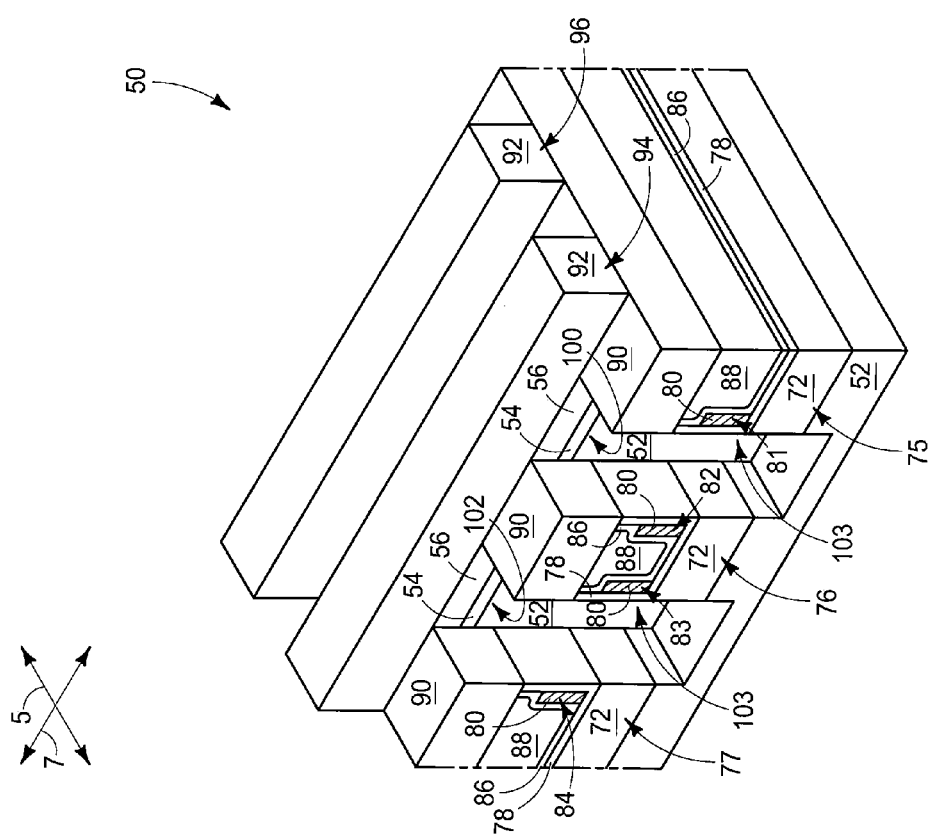

Referring to FIG. 14, materials 52, 54 and 56 are selectively etched relative to carbon-containing materials 90 and 92 to transfer the pattern of lines 94 and 96 into the underlying materials 52, 54 and 56. Such patterns the walls 66 and 68 (FIG. 13) into pillars 100 and 102 under line 92, and into analogous pillars 104 and 106 (not visible in FIG. 14, but shown in FIG. 15) under line 96. The pillars 100 and 102 are spaced apart from one another by a region comprising dielectric material 88. Also, the pillars under line 94 are spaced from those under line 96 by spaces 108 and 110 (not visible in FIG. 14, but shown in FIG. 15). The semiconductor material 52 is selectively etched relative to materials 72 and 78 (which may both consist of silicon dioxide in some embodiments) during formation of pillars 100 and 102 in the shown embodiment.

The etching into material 52 is conducted for suitable duration and under suitable conditions so that the pillars (for instance, pillars 100 and 102) have bottom regions 103 below the gatelines 81-84, and in the shown embodiment have bottom regions below the steps 75-77.

Figure 15:
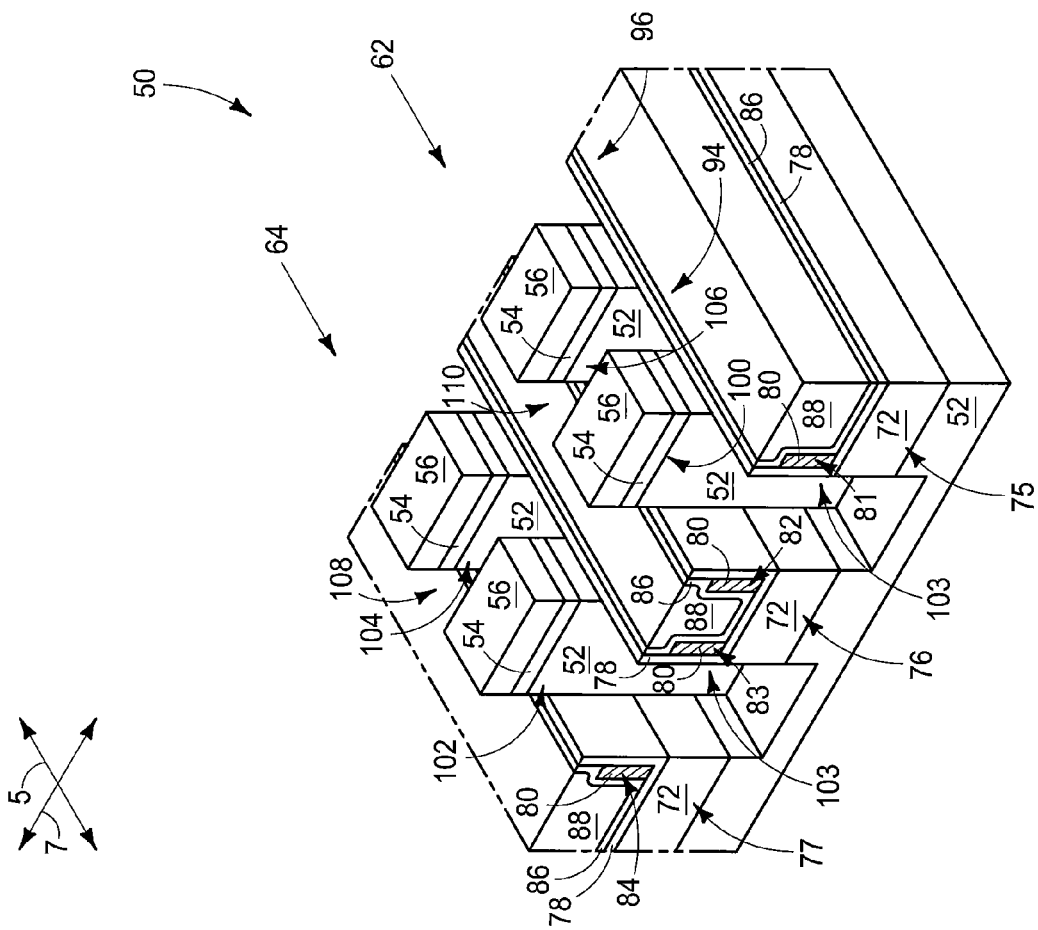

Referring to FIG. 15, the lines 94 and 96 (FIG. 14) of masking material 92 are removed. In embodiments in which material 92 comprises carbon, and in which material 90 (FIG. 14) also comprises carbon, the conditions utilized to remove material 92 may also remove material 90, as shown.

Figure 16:
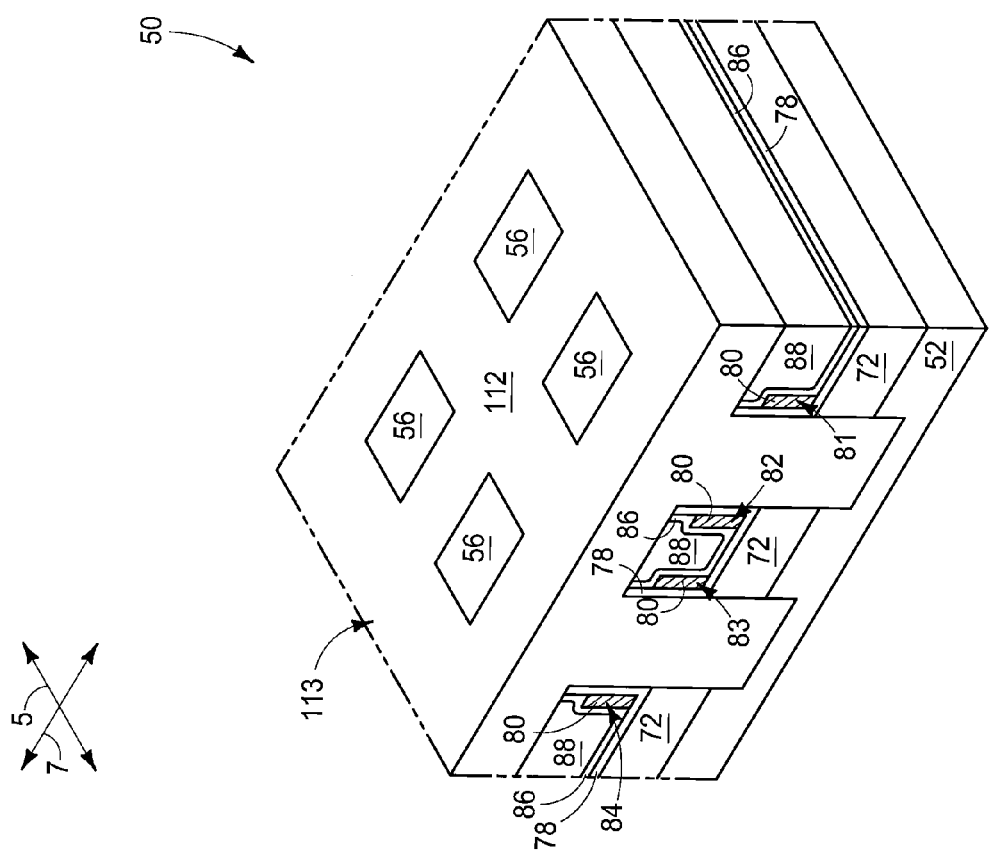

Referring to FIG. 16, dielectric material 112 is formed within spaces between pillars 100, 102, 104 and 106 (FIG. 15). The dielectric material 112 may comprise any suitable composition or combination of compositions; and in some embodiments may comprise, consist essentially of, or consist of silicon dioxide. The dielectric material 112 may be initially formed to overfill the spaces between the pillars, and subsequently planarization (for instance, CMP) may be utilized to form the shown planarized surface 113 extending across materials 56 and 112.

Figure 17:
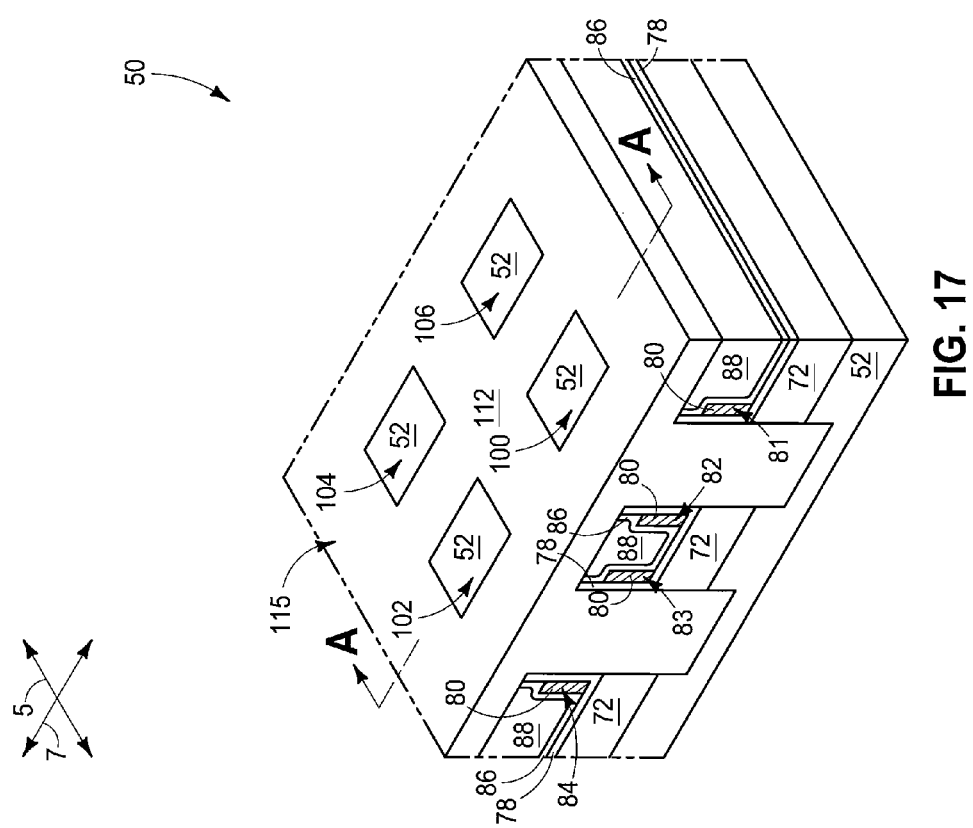

Referring to FIG. 17, additional planarization (or other suitable processing) is conducted to remove materials 54 and 56 (FIG. 15) and form the shown planarized surface 115 extending across the semiconductor material 52 of pillars 100, 102, 104 and 106, as well as across material 112.

Figure 18:
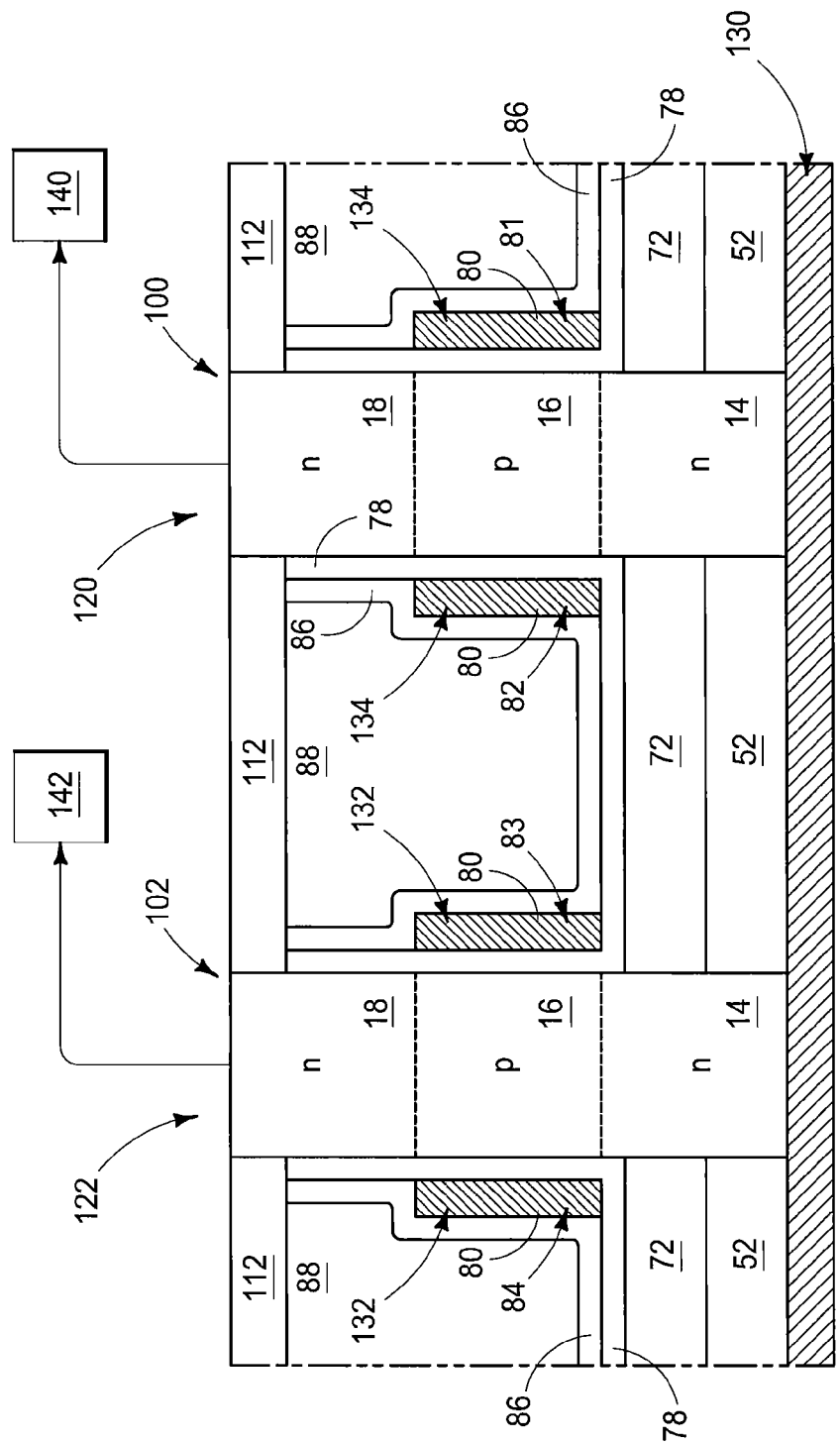
FIG. 18 is a diagrammatic cross-sectional view along a line A-A of FIG. 17 showing a portion of an example embodiment array of transistors that may be fabricated utilizing the processing of FIGS. 3-17.

The pillars 100, 102, 104 and 106 may be appropriately doped to be incorporated into gated devices, such as, for example, transistors or thyristors. For instance, FIG. 18 shows a cross-sectional view along the line A-A of FIG. 17 of an example embodiment in which the pillars 100 and 102 are configured for incorporation into transistors 120 and 122, respectively. The pillars comprise doped regions 14, 16 and 18 of the types described above with reference to FIG. 1. The doping may occur at any suitable processing stage or combination of stages. For instance, in some embodiments at least some of the doping may occur prior to the processing stage of FIG. 3. As another example, the doped region 18 may be formed after removal of materials 54 and 56 (FIG. 15) during fabrication of the configuration of FIG. 17.

The pillars 100 and 102 are shown to be electrically connected to a bitline 130 that extends under the pillars in the shown embodiment (the bitline could be over the pillars 100 and 102 in other embodiments). The bitline may comprise any suitable composition or combination of compositions; and in some embodiments may comprise, consist essentially of, or consist of one or more of various metals (for instance, titanium, tungsten, etc.), metal-containing compounds (for instance, metal silicides, metal nitrides, metal carbides, etc.), and conductively-doped semiconductor materials (for instance, conductively-doped silicon, conductively-doped germanium, etc.). For instance, the bitline may comprise a conductively-doped region of semiconductor material 52. The bitline may be formed at any suitable processing stage; and in some embodiments may be formed prior to the processing stage of FIG. 3. The bitline may extend along the direction of axis 7 (FIG. 17), and accordingly may be orthogonal to the gatelines 81-84 in some embodiments. The gatelines on opposing sides of a pillar may be paired with one another as discussed above with reference to FIG. 1 (i.e., electrically coupled with one another through a connection outside of the page relative to the view of FIG. 18); and accordingly gatelines 83 and 84 may be paired together to form a single wordline 132 extending in and out of the page relative to the cross-sectional view of FIG. 18, and similarly the gatelines 81 and 82 may be paired together to form a single wordline 134 extending in and out of the page relative to the cross-sectional view of FIG. 18. The bitline 130 may be one of a series of bitlines, and the transistors 120 and 122 may be part of an array of transistors which are uniquely addressed through the combination of a bitline and a wordline.

The upper doped regions 18 of pillars 100 and 102 are shown to be electrically connected to devices 140 and 142, respectively. In some embodiments, such devices may be capacitors. In such embodiments, the transistors 120 and 122 and the capacitors 140 and 142 may be part of a DRAM array. In other embodiments, the devices 140 and 142 may be other circuit elements suitable for forming other types of memory arrays and/or logic arrays utilizing transistors 120 and 122.

Figure 19:
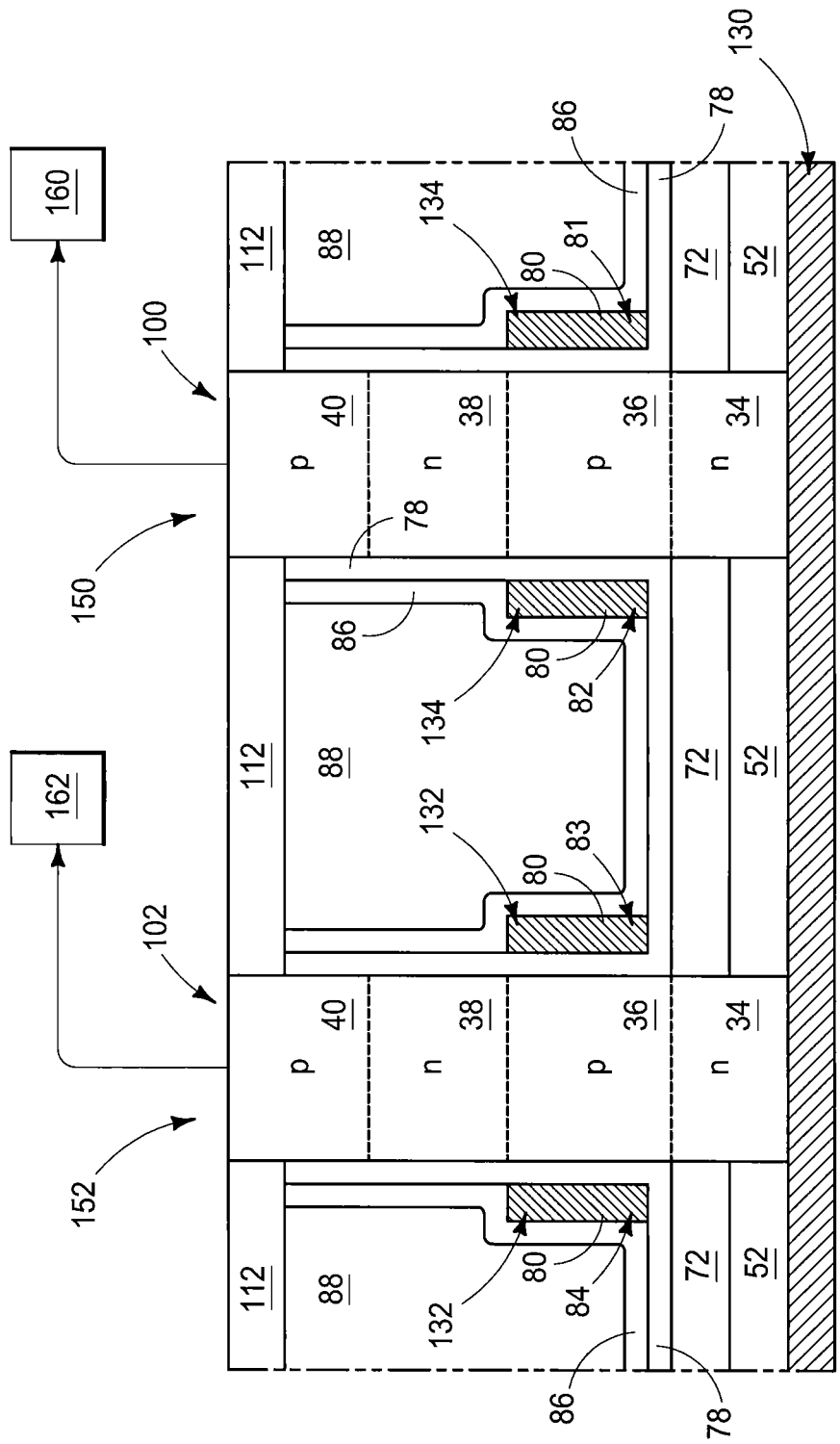
FIG. 19 is a diagrammatic cross-sectional view along the line A-A of FIG. 17 showing a portion of an example embodiment array of gated thyristors that may be fabricated utilizing the processing of FIGS. 3-17.

FIG. 19 shows a cross-sectional view along the line A-A of FIG. 17 of an example embodiment in which the pillars 100 and 102 are configured for incorporation into gated thyristors 150 and 152, respectively. The pillars comprise doped regions 34, 36, 38 and 40 of the types described above with reference to FIG. 2. The doping may occur at any suitable processing stage or combination of stages. For instance, in some embodiments at least some of the doping may occur prior to the processing stage of FIG. 3. As another example, the doped region 40 may be formed after removal of materials 54 and 56 (FIG. 15) during fabrication of the configuration of FIG. 17.

The pillars 100 and 102 are shown to be electrically connected to the bitline 130 that extends under the pillars in the shown embodiment (the bitline could be over the pillars 100 and 102 in other embodiments). The gatelines 83 and 84 are shown to be paired together to form the wordline 132 extending in and out of the page relative to the cross-sectional view of FIG. 18, and similarly the gatelines 81 and 82 are shown to be paired together to form the wordline 134. Accordingly, the gated thyristors 150 and 152 may be part of an array of gated thyristors which are uniquely addressed through the combination of a bitline and a wordline.

The upper doped regions 40 of pillars 100 and 102 are shown to be electrically connected to devices 160 and 162, respectively. The devices 160 and 162 may be any circuit elements suitable for forming memory arrays and/or logic arrays utilizing thyristors 150 and 152.

The electronic devices discussed above may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, clocks, televisions, cell phones, personal computers, automobiles, industrial control systems, aircraft, etc.

The particular orientation of the various embodiments in the drawings is for illustrative purposes only, and the embodiments may be rotated relative to the shown orientations in some applications. The description provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections in order to simplify the drawings.

When a structure is referred to above as being "on" or "against" another structure, it can be directly on the other structure or intervening structures may also be present. In contrast, when a structure is referred to as being "directly on" or "directly against" another structure, there are no intervening structures present. When a structure is referred to as being "connected" or "coupled" to another structure, it can be directly connected or coupled to the other structure, or intervening structures may be present. In contrast, when a structure is referred to as being "directly connected" or "directly coupled" to another structure, there are no intervening structures present.

For purposes of interpreting this disclosure and the claims that follow, a first material is considered to be "selectively removed" (or "selectively etched") relative to a second material if the first material is removed at a faster rate than the second material; which can include, but is not limited to, embodiments in which the first material is removed under conditions which are 100 percent selective for the first material relative to the second material.

Some embodiments include a method of forming gated devices. An upper region of a semiconductor material is patterned into a plurality of walls that extend primarily along a first direction. The walls are spaced from one another by trenches that extend primarily along the first direction. Steps are formed along bottoms of the trenches, and gatelines are formed on the steps and along lower regions of the walls. After the gatelines are formed, the walls are patterned into spaced-apart pillars that have bottom regions below the gatelines.

Some embodiments include a method of forming gated devices. A first patterned mask is formed over a semiconductor material. The first patterned mask comprises a series of first lines extending primarily along a first direction. A pattern is transferred from the first patterned mask into the semiconductor material to form a plurality of walls that extend primarily along the first direction. The walls are spaced from one another by trenches that extend primarily along the first direction. First dielectric material steps are formed along bottoms of the trenches. Gate dielectric is formed along the walls. Gate material is formed over the steps and is spaced from the walls by the gate dielectric. The gate material is etched to form gatelines along lower regions of the walls. Second dielectric material is formed within the trenches and over the gatelines. A second patterned mask is formed over the walls and the second dielectric material. The second patterned mask comprises a series of second lines that extend primarily along a second direction that intersects the first direction. A pattern is transferred from the second patterned mask through the walls to pattern the walls into spaced-apart pillars having bottom regions below the gatelines.

Some embodiments include a method of forming gated devices. A first patterned mask is formed over a monocrystalline silicon substrate. The first patterned mask comprises a series of first lines that extend primarily along a first direction. A pattern is transferred from the first patterned mask into monocrystalline silicon of the substrate to form a plurality of walls that extend primarily along the first direction. The walls are spaced from one another by trenches that extend primarily along the first direction. First dielectric material steps are formed along bottoms of the trenches. Gate dielectric is formed along the walls. Gate material is formed over the steps and is spaced from the walls by the gate dielectric. The gate material is etched to form gatelines along lower regions of the walls. Second dielectric material is formed within the trenches and over the first patterned mask. The second dielectric material is recessed to a level below the first patterned mask to open upper regions of the trenches and expose upper regions of the walls. Carbon-containing material is formed within the upper regions of the trenches. A second patterned mask is formed over the first patterned mask and the carbon-containing material. The second patterned mask comprises a series of second lines that extend primarily along a second direction that intersects the first direction. A pattern is transferred from the second patterned mask through the first patterned mask and the walls to pattern the walls into spaced-apart pillars having bottom regions below the gatelines.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A method of forming gated devices, comprising:
   patterning an upper region of a semiconductor material into a plurality of walls that extend primarily along a first direction; the walls being spaced from one another by trenches that extend primarily along the first direction;
   forming steps along bottoms of the trenches, and forming gatelines on the steps and along lower regions of the walls; and
   after forming the gatelines, patterning the walls into spaced-apart pillars, the pillars having bottom regions below the gatelines.

2. The method of claim 1 wherein the semiconductor material comprises silicon, and wherein the patterning of the walls into spaced-apart pillars comprises:
   forming a patterned carbon-containing mask over the walls; and
   etching the silicon selectively relative to the carbon-containing mask.

3. The method of claim 2 wherein the carbon-containing mask is a second carbon-containing mask, and further comprising forming a first carbon-containing mask within the trenches prior to forming the second carbon-containing mask; the second carbon-containing mask extending across the first carbon-containing mask and the walls.

4. The method of claim 3 further comprising forming silicon dioxide over the gatelines and within the trenches prior to forming the first and second carbon-containing masks; and wherein the etching of the silicon also etches the silicon selectively relative to the silicon dioxide.

5. The method of claim 1 wherein the pillars comprise three vertically-stacked doped regions; and wherein the gated devices are transistors.

6. The method of claim 1 wherein the pillars comprise four vertically-stacked doped regions; and wherein the gated devices are thyristors.

7. The method of claim 1 wherein the steps comprise silicon dioxide.

8. The method of claim 7 wherein the steps are formed by filling the trenches with silicon dioxide, and then recessing the silicon dioxide to leave it only along the bottoms of the trenches.

9. A method of forming gated devices, comprising:
   forming a first patterned mask over a semiconductor material, the first patterned mask comprising a series of first lines extending primarily along a first direction;
   transferring a pattern from the first patterned mask into the semiconductor material to form a plurality of walls that extend primarily along the first direction; the walls being spaced from one another by trenches that extend primarily along the first direction;
   forming first dielectric material steps along bottoms of the trenches;
   forming gate dielectric along the walls;
   forming gate material over the steps and spaced from the walls by the gate dielectric;
   etching the gate material to form gatelines along lower regions of the walls;
   forming second dielectric material within the trenches and over the gatelines;
   forming a second patterned mask over the walls and the second dielectric material, the second patterned mask comprising a series of second lines extending primarily along a second direction that intersects the first direction; and
   transferring a pattern from the second patterned mask through the walls to pattern the walls into spaced-apart pillars having bottom regions below the gatelines.

10. The method of claim 9 further comprising forming a first carbon-containing mask within the trenches after forming the second dielectric material; and wherein the second patterned mask is a second carbon-containing mask which extends across the first carbon-containing mask and the walls.

11. The method of claim 9 wherein the semiconductor material comprises monocrystalline silicon.

12. The method of claim 9 wherein the second direction is substantially orthogonal to the first direction.

13. The method of claim 9 wherein the gate material comprises one or more metals.

14. The method of claim 9 wherein the first patterned mask comprises silicon nitride, and wherein the second patterned mask comprises carbon.

15. The method of claim 9 wherein the second dielectric material comprises silicon dioxide.

16. The method of claim 15 further comprising:
    forming silicon nitride along the walls and over the gatelines to narrow the trenches prior to forming the second dielectric material; and
    forming the silicon dioxide of the second material in a two-step process comprising deposition of low-density material followed by an anneal to increase density of the material.

17. The method of claim 9 wherein the gated devices are transistors.

18. The method of claim 9 wherein the gated devices are thyristors.

19. A method of forming gated devices, comprising:
    forming a first patterned mask over a monocrystalline silicon substrate, the first patterned mask comprising a series of first lines extending primarily along a first direction;
    transferring a pattern from the first patterned mask into monocrystalline silicon of the substrate to form a plurality of walls that extend primarily along the first direction; the walls being spaced from one another by trenches that extend primarily along the first direction;
    forming first dielectric material steps along bottoms of the trenches;
    forming gate dielectric along the walls;
    forming gate material over the steps and spaced from the walls by the gate dielectric;
    etching the gate material to form gatelines along lower regions of the walls;
    forming second dielectric material within the trenches and over the first patterned mask;
    recessing the second dielectric material to a level below the first patterned mask to open upper regions of the trenches and expose upper regions of the walls;
    forming carbon-containing material within the upper regions of the trenches;
    forming a second patterned mask over the first patterned mask and the carbon-containing material, the second patterned mask comprising a series of second lines extending primarily along a second direction that intersects the first direction; and
    transferring a pattern from the second patterned mask through the first patterned mask and the walls to pattern the walls into spaced-apart pillars having bottom regions below the gatelines.

20. The method of claim 19 wherein the carbon-containing material is formed within the upper regions of the trenches and over the first patterned mask; and further comprising utilizing a dry etch back to remove the carbon-containing material from over the first patterned mask.

21. The method of claim 20 wherein the carbon-containing material within the upper regions of the trenches is a first carbon-containing mask, and wherein the second patterned mask is a second carbon-containing mask which extends across the first carbon-containing mask and the walls.

22. The method of claim 19 wherein the carbon-containing material is formed within the upper regions of the trenches and over the first patterned mask; and further comprising utilizing planarization to remove the carbon-containing material from over the first patterned mask and to form a planarized surface extending across the first patterned mask and across the carbon-containing material within the upper regions of the trenches.

23. The method of claim 22 wherein the carbon-containing material within the upper regions of the trenches is a first carbon-containing mask, and wherein the second patterned mask is a second carbon-containing mask which extends across the first carbon-containing mask and the walls.

24. The method of claim 19 wherein the first dielectric material comprises silicon dioxide.

25. The method of claim 19 wherein the gate dielectric comprises silicon dioxide.

26. The method of claim 19 further comprising forming silicon nitride within the trenches to narrow the trenches, and forming the second dielectric material within the narrowed trenches.

27. The method of claim 19 wherein the first patterned mask comprises silicon nitride, and wherein the second dielectric material comprises silicon dioxide.

28. The method of claim 19 further comprising, prior to recessing the second dielectric material, planarizing the second dielectric material to form a planarized surface extending across the second dielectric material and the first patterned mask.

29. The method of claim 19 wherein the first patterned mask comprises silicon nitride and the second patterned mask comprises carbon.

30. The method of claim 29 wherein the second patterned mask comprises photolithographically-patterned photoresist.

31. The method of claim 19 wherein the gated devices are an array of gated transistors; with bitlines being electrically coupled with the pillars and extending primarily along the second direction.

32. The method of claim 19 wherein the gated devices are an array of gated thyristors; with bitlines being electrically coupled with the pillars and extending primarily along the second direction.

* * * * *